(12) United States Patent
Leu et al.

(10) Patent No.: US 6,943,121 B2
(45) Date of Patent: Sep. 13, 2005

(54) SELECTIVELY CONVERTED INTER-LAYER DIELECTRIC

(75) Inventors: Jihperng Leu, Portland, OR (US); Grant M. Kloster, Lake Oswego, OR (US); David H. Gracias, Portland, OR (US); Lee D. Rockford, Portland, OR (US); Peter K. Moon, Portland, OR (US); Chris E. Barns, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/302,073

(22) Filed: Nov. 21, 2002

(65) Prior Publication Data

US 2005/0181593 A1  Aug. 18, 2005

(51) Int. Cl.[7] .................... H01L 21/302; H01L 21/461; H01L 21/31; H01L 21/469
(52) U.S. Cl. .................... 438/725; 438/780; 438/781; 438/783
(58) Field of Search .................... 438/623, 725, 438/780, 781, 783

(56) References Cited

U.S. PATENT DOCUMENTS

| | | | | |
|---|---|---|---|---|
| 6,528,409 B1 * | 3/2003 | Lopatin et al. | ............. | 438/618 |
| 6,770,537 B2 * | 8/2004 | Farrar | ......................... | 438/296 |
| 2003/0004218 A1 * | 1/2003 | Allen et al. | .................... | 521/77 |
| 2003/0057414 A1 * | 3/2003 | Dalton et al. | .................. | 257/3 |
| 2004/0061229 A1 * | 4/2004 | Moslehi | ...................... | 257/758 |

* cited by examiner

*Primary Examiner*—William M. Brewster
(74) *Attorney, Agent, or Firm*—Blakely, Sokoloff, Taylor & Zafman LLP

(57) ABSTRACT

An inter-layer dielectric structure and method of making such structure are disclosed. A composite dielectric layer, initially comprising a porous matrix and a porogen, is formed. Subsequent to other processing treatments, the porogen is decomposed and removed from at least a portion of the porous matrix, leaving voids defined by the porous matrix in areas previously occupied by the porogen. The resultant structure has a desirably low k value as a result of the porosity and materials comprising the porous matrix and porogen. The composite dielectric layer may be used in concert with other dielectric layers of varying porosity, dimensions, and material properties to provide varied mechanical and electrical performance profiles.

12 Claims, 4 Drawing Sheets

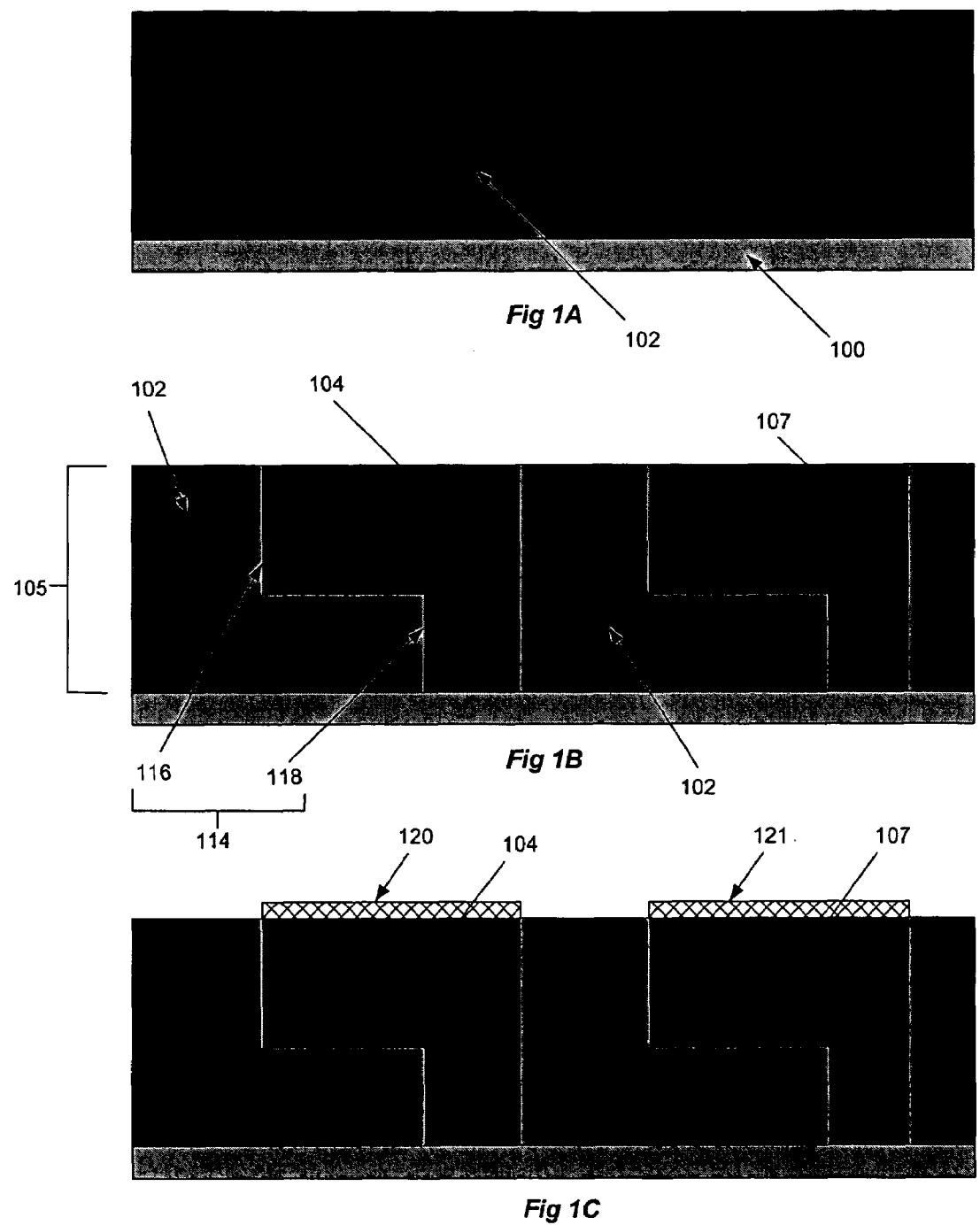

SELECTIVELY CONVERTED INTER-LAYER DIELECTRIC

BACKGROUND OF THE INVENTION

Low dielectric constant materials are used as interlayer dielectrics in microelectronic structures, such as semiconductor structures, to reduce the RC delay and improve device performance. As device sizes continue to shrink, the dielectric constant of the material between metal lines must also decrease to maintain the improvement. Certain low-k materials have been proposed, including various carbon-containing materials such as organic polymers and carbon-doped oxides. Although such materials may serve to lower the dielectric constant, they may offer inferior mechanical properties such as poor strength and low fracture toughness. The eventual limit for a dielectric constant is k=1, which is the value for a vacuum. Methods and structures have been proposed to incorporate void spaces or "air gaps" in attempts to obtain dielectric constants closer to k=1. One major issue facing low-k void technology is how to remove sacrificial material to facilitate multi-layer structures. Another major issue facing low-k void technology is how to facilitate void creation while providing a structure which can withstand conventional processing treatments, such as chemical-mechanical polishing and thermal treatment, as well as post processing mechanical and thermo-mechanical rigors.

Accordingly, there is a need for a microelectronic device structure incorporating air gaps or voids which has low-k dielectric properties, can be used in multi-layer structures, and has acceptable mechanical characteristics during and after processing.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

FIGS. 1A–1E depict cross-sectional views of various aspects of one embodiment of the present invention incorporating a dielectric layer which may be modified using thermal or chemical treatments.

DETAILED DESCRIPTION

Figure 1D:
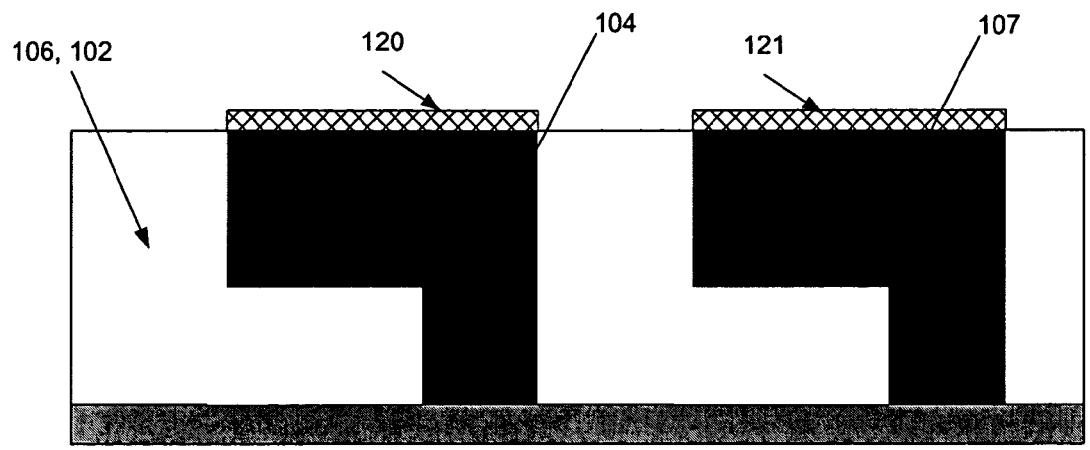

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Referring to FIG. 1A, a substrate layer (100) is shown in cross section adjacent a first inter-layer dielectric (hereinafter "ILD") layer (102). The substrate (100) may be any surface generated when making an integrated circuit, upon which a conductive layer may be formed. Substrate (100) thus may comprise, for example, active and passive devices that are formed on a silicon wafer, such as transistors, capacitors, resistors, diffused junctions, gate electrodes, local interconnects, etcetera. Substrate (100) may also comprise insulating materials (e.g., silicon dioxide, either undoped or doped with phosphorus or boron and phosphorus; silicon nitride; silicon oxynitride; or a polymer) that separate active and passive devices from the conductive layer or layers that are formed adjacent them, and may comprise other previously formed conductive layers.

The first ILD layer (102) is a composite dielectric material comprising a porous matrix material and a porogen material deposited together in a single layer as shown, with the porogen occupying pores defined by the porous matrix. A distinction is made between a "porous" material having pores, and a material having "voids", voids differing from pores in that voids are substantially unoccupied by solid material, whereas pores may or may not be so occupied. The porogen and matrix materials are selected to enable selective decomposition and removal of the porogen, without significant detriment to the matrix material. Such a combination of properties allows for a controlled conversion between a first ILD layer which is substantially solid, mechanically relatively robust, and electrically relatively high in capacitance, to a first ILD layer which may be substantially porous, mechanically weaker, and lower in capacitance at a desired point during the structure formation process. In particular, such a controlled conversion may be executed subsequent to process treatments where more mechanical robustness is preferred, such as polishing, trenching, and dielectric layer formation, as is discussed in further detail below.

The first ILD layer (102) preferably comprises a matrix material ("matrix") having pores of relatively uniform size and distribution within the volume occupied by the first ILD layer, the pores being substantially interconnected to facilitate decomposition and removal of portions of porogen material residing within the pores defined by the porous matrix material, to convert the pertinent pores to voids. In one embodiment porous matrix may comprise silicon dioxide or a compound having the molecular structure $Si_x O_y R_z$, in which R is selected from the group consisting of hydrogen, carbon, an aliphatic hydrocarbon and an aromatic hydrocarbon. When "R" is an alkyl or aryl group, the resulting composition is often referred to as "carbon-doped oxide" ("CDO"). When the porous matrix comprises a carbon-doped oxide, it preferably comprises between about 5 and about 50 atom % carbon. More preferably, such a compound includes about 15 atom % carbon. A polymeric material comprising cross-linked poly(phenylene), poly(arylether), polystyrene, crosslinked polyarylene, polymethylmethacrylate, aromatic polycarbonate, aromatic polyimide, or silsesquioxanes such as methyl silsesquioxane ("MSQ") and/or hydrogen silsesquioxane ("HSQ") also may be formed into porous matrix. While single-phase polymers by themselves generally do will not form interconnected pores, several preferred techniques are available to do so. In one embodiment, porogen particles having one dimension larger than the desired matrix film thickness may be used to ensure transport channeling across a polymer matrix. In another embodiment, modifications to the surface chemistry of a porogen material, or the inherent surface chemistry of porogen materials such as fumed silica, may produce an aggregated structure with high interconnectivity of porogens. In another embodiment, a polymer matrix may be combined with a sufficient amount of porogen such that the porogen will define pore interconnectivity within a polymer matrix. It is known, for example, that porogen loading greater than about 30% by weight percentage is likely to result in pore interconnectivity.

In the completed microelectronic structure, it is desirable to have a first ILD layer (102) comprising a porous matrix with relatively high porosity. Using porous matrix materials such as those mentioned herein, combined with structure-enhancing removable porogens such as those discussed below, ILD structures having aggregate void volumes, defined as the sum of the volumes of all pores not occupied by solid material, preferably greater than 80% of the total volume of the ILD structure may be successfully formed and left intact for subsequent device operation. Pores defined by the matrix may have sizes varying from about 5 angstroms to about 100 nanometers in average diameter, depending upon the size of the porogen in most combinations, the term "average diameter", conventionally calculated as twice the cube root of (0.75*actual pore volume/pi), being in reference to the fact that the pores generally are not perfectly spherical in shape. To facilitate the formation of other adjacent layers with substantially uniform surfaces, pores larger than 10 nanometers in diameter may not be desired.

In one embodiment, the porogen may be selectively decomposed and removed from the porous matrix of the first ILD layer on the basis of differences in thermal decomposition temperatures between the porous matrix material and the porogen. For example, a pairing of a porogen chosen from the group consisting of branched poly(p-xylene), linear poly(p-phenylene), linear polybutadiene, and branched polyethylene, which have thermal decomposition temperatures of about 425–435 degrees C., about 420–430 degrees C., about 400–410 degrees C., and about 400–410 degrees C., respectively, and a porous matrix material having a higher thermal decomposition temperature, suitable candidates comprising cross-linked poly(phenylene), poly(arylether), aromatic polyimides, and aromatic polycarbonates, each of which has a thermal decomposition temperature above 440 degrees C., may contribute to selective removal of a thermally decomposed porogen, or a "porogen decomposition", as facilitated, for example, by introduction of an oxygen or hydrogen rich carrier plasma to carry away, or remove, the decomposition, as is known to those skilled in the art as a standard plasma enhanced carrier technique. Other suitable materials for use as porogens, along with their respective thermal decomposition temperatures, include but are not limited to: poly(ethylene terephthalate) ("PET")—about 300 degrees C., polyamide-6,6 ("Nylon 6/6")—about 302 degrees C., syndiotactic polystyrene ("PS-syn")—about 320 degrees C., poly(e-caprolactone)—about 325 degrees C., poly(propylene oxide) ("PPO")—about 325–375 degrees C., polycarbonates—about 325–375 degrees C., poly(phenylene sulfide) ("PPS")—about 332 degrees C., polyamideimide ("PAI")—about 343 degrees C., polyphthalamide ("PPA", "Amodel")—about 350 degrees C., poly(a-methylstyrene) ("PMS")—about 350–375 degrees C., poly(ether ether ketone) ("PEEK")—about 399 degrees C., poly(ether sulfone) ("PES")—about 400 degrees C., poly(ether ketone) ("PEK")—about 405 degrees C. Thermally decomposing a porogen material may be facilitated using conventional heating equipment, such as a furnace or oven. Depending upon the materials selected, plasma tools may be appropriate as well, as would be apparent to one skilled in the art.

Many of the aforementioned polymeric porogen materials also may be selectively decomposed without substantial decomposition of the aforementioned preferred polymeric porous matrix materials by introducing chemical solvents and agents, such as propylene glycol monomethyl ether acetate, a versatile solvent used in many applications, cyclohexanone, a ketone solvent, ketenes such as 1-ene-3-cyclohexanone, hydrogen peroxide, tert-butyl peroxide, and solutions containing the cerium(IV) ion, to a porogen susceptible to chemical break-down by the pertinent chemical agents, and to matrix which preferably is not substantially effected by such chemical agent exposure. Polymeric porogen materials may need functionalization with polar groups such as hydroxy or alkoxy groups for solvent compatibility with the selected solvent or agent, as is convention to those skilled in the art. To clarify the simplified terminology used herein as associated with the thermal or chemical break-down of sacrificial materials for subsequent removal, references to "decompositions" and "decomposing" comprise reference to "dissolving" and "dissolution" as well, or more simply, "break-down" by thermal or chemical means.

Given the variety of suitable materials, many pairings of porous matrix and porogen may be successfully paired and selectively decomposed, depending upon the mode of decomposition, surrounding materials, and environmental limitations. Thermal and chemical modalities for facilitating selective decomposition and removal of porogen materials are preferred, in part because precise thermal and chemical treatments are convention in microelectronic device processing. In a preferred thermal transformation embodiment, both the porous matrix and porogen comprise polymeric dielectric materials, the porous matrix having a higher thermal decomposition temperature, in addition to a high glass transition temperature for thermo-mechanical stability. With such a pairing, the first ILD layer may be heated to a temperature above the thermal decomposition temperature for the porogen but below the thermal decomposition temperature for the porous matrix, to facilitate removal of the porogen decomposition before subsequent cooling. In a preferred chemical transformation embodiment, chemically-enhanced decomposition of the selected porogen material results is substantially no decompositon of the associated porous matrix material or other adjacent materials.

Preferred pairings of matrix and porogen materials, for example, include but are not limited to: an oligomeric porogen, such as a low molecular weight polystyrene, grafted as a side chain onto a tetraethylorthosilicate ("TEOS") porous matrix polymer; crosslinked polyarylene matrix combined with polystyrene porogen; silicon dioxide matrix with polyethylene oxide porogen; silicon dioxide matrix with polynorbornene-based porogen such as that sold under the trade name "Unity™400" by Promerus LLC; and CDO matrix with polyethylene or polyethylene oxide porogen. Each of these matrix materials has a higher thermal decomposition temperature as compared with the matched porogen, and is substantially insoluble in conventional chemical agents and solvents such as those mentioned above, while the paired porogens are soluble in such agents and solvents. In terms of thermal decomposition temperatures, low molecular weight polystyrene, polystyrene, polyethylene oxide, and polynorbornene thermally decompose at about 375, 375, 350, and 400–425 degrees Celsius, respectively, while TEOS and silicon dioxide thermally decompose at temperatures over 500 degrees Celsius, and crosslinked polyarylene thermally decomposes at about 400 degrees Celsius. Therefore, selective decomposition, either chemical or thermal, may be utilized to separate these pairings.

Referring back to FIG. 1A, the first ILD layer (102) may be formed adjacent the substrate layer (100) using a variety of conventional techniques, such as spin-on or spin coating, spin-casting out of solution, evaporative deposition, chemical vapor deposition, or plasma-enhanced chemical vapor deposition, depending upon the particular materials selected as porogen and porous matrix, as would be apparent to one skilled in the art. The first ILD layer (102) preferably has a thickness between about 10 nanometers to about 2,000 nanometers. In the case of spin coating or other deposition methods, solvent may need to be removed using evaporative techniques familiar to those skilled in the art.

Referring to FIG. 1B, two conductive layers (104, 107) are shown crossing the first ILD layer (102). Each of the conductive layers (104, 107), comprising materials conventionally used to form conductive layers in integrated circuits, and preferably comprising metals such as copper, aluminum, and alloys thereof, is formed using known techniques. For example, the depicted embodiment is formed using known dual damascene techniques, wherein a trench (114) is formed for each conductive layer using conventional lithography, etching, and cleaning techniques, the trench having a via portion (118) and a line portion (116), the line portion (116) having a width preferably between about 10 nanometers and about 2,000 nanometers. The trench may then be lined with a barrier layer (not shown) to isolate conductive material, after which the trench (114) is filled with a conductive material using, for example, known electroplating, chemical vapor deposition, or physical deposition techniques, to form a conductive layer such as those depicted (104, 107). With copper metal conductive layers, a barrier layer comprising, for example, tantalum, tantalum nitride or tungsten, is effective for isolating the copper. Such barrier layers may be deposited using conventional techniques such as chemical vapor deposition, atomic layer deposition, or other techniques as would be apparent to those skilled in the art. Known polymeric barrier layers may also be employed, subject to the requirement that they be selected from the subgroup of polymer barrier materials which have relatively good electromigration characteristics. Alternatively, a conductive layer (104) may be made from doped polysilicon or a silicide, e.g., a silicide comprising tungsten, titanium, nickel, or cobalt, and formed using conventional techniques.

The resultant interconnect layer (105) has conductive layers (104, 107) positioned between remaining portions of the first ILD layer (102). The spacing between the conductive layers (104, 107) may vary with the feature size of the microelectronic structure as would be apparent to one skilled in the art, and preferably is between about 10 nanometers and about 1,000 nanometers.

Figure 2A:
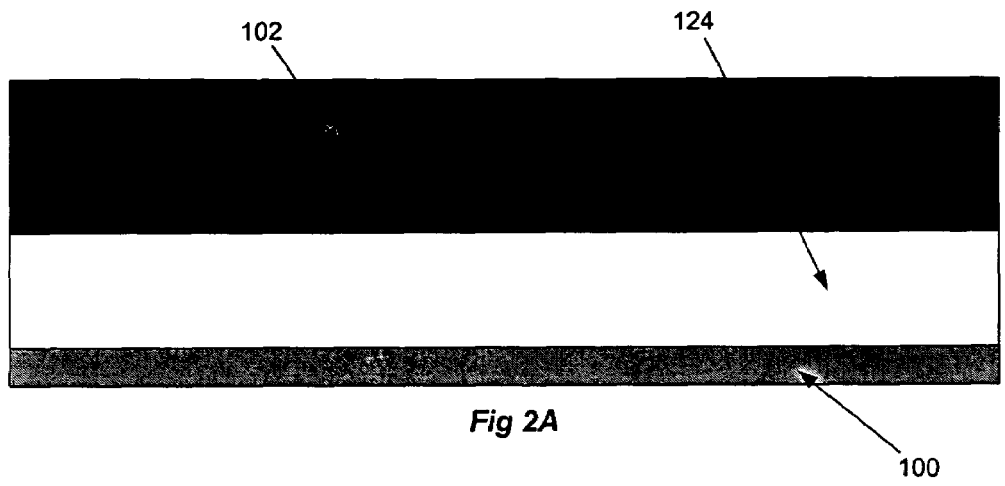
FIGS. 2A–2E depict cross-sectional views of various aspects of another embodiment of the present invention incorporating an additional dielectric layer between the dielectric layer and the substrate.
Figure 2B:
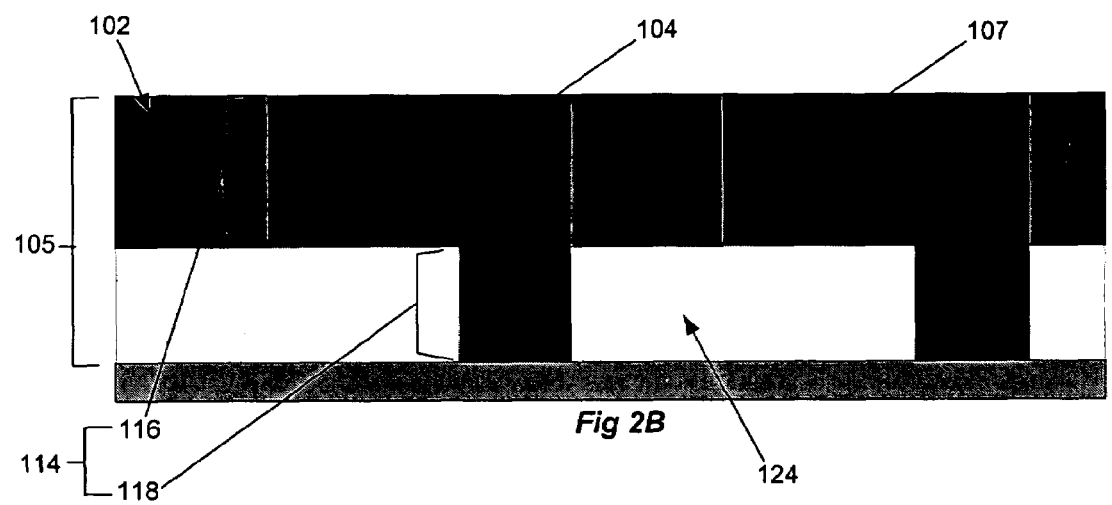
Figure 2C:
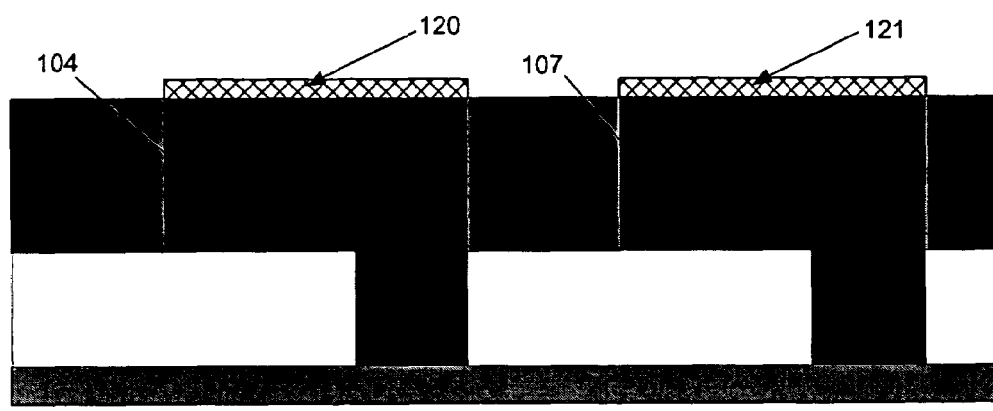
Figure 2D:
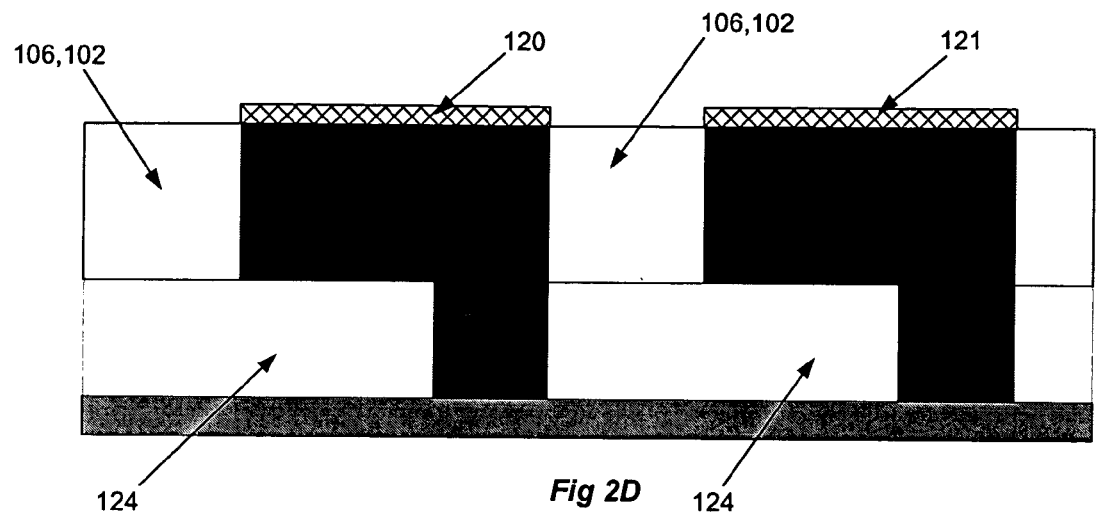

It is important to note that while a damascene type process is illustrated in reference to FIGS. 1B–1C and 2B–2C, wherein the conductive layer is formed into trenches using electroplating techniques, the dielectric aspect of the invention, illustrated in summary fashion with the transformation from structures like that of FIG. 2C to structures like that of FIG. 2D, may be similarly applied to structures formed using other conventional techniques for forming conductive layers, such as subtractive metallization, given that the appropriate materials are in place as further described herein. As would be apparent to one skilled in the art, subtractive metallization may involve formation of adjacent dielectric layers after formation of conductive layers, and the geometries of conductive layers formed may vary from those available with electroplating processes such as dual damascene.

Depending upon the selected conductive material, a shunt layer may be formed over the conductive layers using conventional techniques and materials, to isolate the conductive layers from subsequent treatments and materials. With copper metal conductive layers, a metal shunt layer comprising, for example, cobalt or tungsten, is effective for isolating the copper. The shunt material is deposited using conventional techniques such as chemical vapor deposition, subsequent to a planarization treatment using known techniques such as chemical-mechanical planarization (hereinafter "CMP"). Shunt material deposited upon the exposed portions of the first ILD layer (102) may be removed using subsequent CMP or etch back, as would be apparent to those skilled in the art. The depiction in FIG. 1C shows such portions already removed, resulting in two smaller shunt layers (120, 121) only substantially covering the conductive layers (104, 107) at a thickness preferably between about 5 nanometers and about 100 nanometers. Shunt materials such as tungsten may also be selectively deposited using techniques such as electroless processing, which generally obviate the need for etch back or CMP to remove shunt material from adjacent dielectric layers.

Referring to FIG. 1D, the structure of FIG. 1C is shown subsequent to a controlled decomposition and removal of at least a portion of the porogen material, leaving the first ILD layer (102) to comprise the remaining porous matrix material (106) and any residual porogen (not shown). As discussed above in reference to FIG. 1A, the transformation from the embodiment of FIG. 1C, which is more mechanically robust and higher in capacitance, to the embodiment of FIG. 1D, which is less mechanically robust and lower in capacitance, is controlled by a porogen decomposition and removal subprocess which leaves the porous matrix and other structures intact, and a diffusion pathway of voids defined by the porous matrix.

Subsequent to the decomposition of at least a portion of the porogen using thermal energy, selective chemical solvents or agents, or other known selective decomposition techniques, the porogen decomposition or a portion thereof is removed from the first ILD layer (102), leaving voids defined by the matrix and any remaining porogen. With the aforementioned selective decompostion modalities, preferably the porogen is decomposed without substantial decomposition of the matrix. Selective thermal decomposition preferably comprises heating the porogen and matrix to a temperature above the thermal decomposition temperature of the porogen material, and below the thermal decomposition temperature of the matrix. Selective chemical decomposition preferably comprises exposing the porogen and matrix to a chemical agent which breaks up, dissolves, or decomposes the porogen, without any substantial effect to the matrix ("selective" to the porogen). Removal of decompositions may occur as a byproduct of decomposition process, as in the scenario wherein gases carrying portions of a porogen decomposition may be exhausted away from the porous matrix material given an available gradient pathway, or may occur as facilitated by introduction of reactive carriers within the proximity of the porogen decomposition using conventional techniques. Preferred reactive carriers, or "carrier plasmas", include oxygen and hydrogen rich plasmas, which are known to actively absorb and transport materials or portions thereof due to the high reactivity of oxygen and plasma. Chemical cleaning or etching agents, such as supercritical carbon dioxide, which are also known to absorb and transport decomposed materials, may also be used to remove porogen decompositions. For example, a porogen decomposition may be removed with the introduction and removal of supercritical carbon dioxide to carry the porogen decomposition away from the matrix. Plasma and supercritical carbon dioxide treatments require special process equipment and environments, as is convention to those skilled in the art. Therefore the "removing" subprocess may comprise an active or passive subprocess; active in the scenario wherein a gradient is actively created through, for example, introduction of a carrier plasma, and passive in the scenario wherein a gradient is present and a decomposition is allowed, for example, to exhaust away.

Figure 1E:
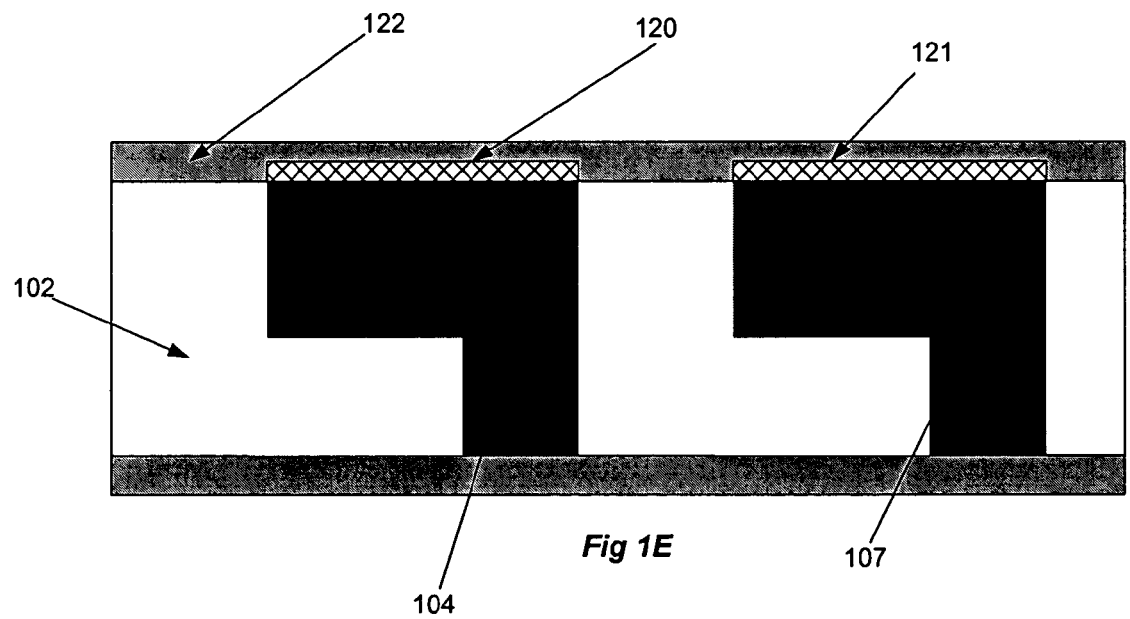

Referring to FIG. 1E, a dielectric layer (122) is shown adjacent the shunts (120, 121) and exposed portions of the first ILD layer (102). The dielectric layer (122) may comprise an etch stop material such as silicon nitride, to assist in the formation of subsequent layers as is known in the art. It may also comprise a dielectric or other material substantially impermeable to liquids and gases, to prevent interaction between subsequently formed layers and the transformed first ILD layer (102). The dielectric layer (122) may also comprise conventional spin-on glass or spin-on polymeric dielectric materials, or chemical-vapor-deposited films such as silicon carbide. It may be desirable, for example, to position a dielectric layer (122) which not only provides a relatively uniform surface onto which subsequent layers may be successfully formed, but also seals in gases such as trace hydrocarbons which may reside within the voids of the transformed first ILD layer (102). Indeed, an optional process treatment (not shown) is the introduction of gas, such as nitrogen or argon and/or other inert gases, into the voids of the first ILD layer (102), the gas being selected to improve electrical, thermal, corrosion, and/or processing properties of the associated structures. High thermal conductivity gases, such as hydrogen or helium, may also be introduced into the voids. The dielectric layer (122) may be deposited with a thickness between about 5 nanometers and about 100 nanometers, preferably between about 10 nanometers and about 50 nanometers.

Referring to FIGS. 2A–2E, another embodiment of the invention is depicted, this embodiment varying from that of FIGS. 1A–1E in that a second ILD layer (124) is positioned between the first ILD layer (102) and the substrate layer (100). Such an embodiment may be used to provide a structure with hybrid mechanical and electrical qualities. For instance, the second ILD layer (124) may comprise a dielectric material which is higher in mechanical strength and electrical capacitance than the first ILD layer (102)—particularly after a first ILD layer (102) has been transformed by decomposition and removal of the porogen comprising the first ILD layer (102), resulting in a structure such as that depicted in FIG. 2D. Referring to FIG. 2B, the illustrative embodiment of the second ILD layer (124) is located adjacent the via portion (118) of the conductive layer, while the line portion (116) is adjacent the first ILD layer (102). Such a configuration adds sustained mechanical integrity to the relatively narrow via portion (118), and also provides desirable insulative properties most closely adjacent the line portion (116) of the conductive layer. Referring back to FIG. 2A, the second ILD layer (124) may comprise any material that may insulate one conductive layer from another, and preferably comprises a material appropriately matched with materials comprising the first ILD layer in accordance with the desired modality of decomposition to enable the second ILD layer to remain structurally intact. For example, if a porogen comprising the first ILD layer is to be thermally decomposed, the material comprising the second ILD layer preferably has a relatively higher thermal decomposition temperature. Similarly, if a porogen is to be chemically decomposed using a solvent, for example, the material comprising the second ILD layer preferably will be substantially insoluble in the preferred solvent.

The second ILD layer (124) may comprise silicon dioxide (either undoped or doped with phosphorus or boron and phosphorus); silicon nitride; silicon oxy-nitride; porous oxide; an organic containing silicon oxide; or a polymer. Silicon dioxide, silicon nitride, and silicon oxy-nitride preferably have relatively high mechanical strength characteristics as compared with many suitable porous matrix materials. Also preferred are polymers or carbon doped oxides, as further described above, with a low dielectric constant: preferably less than about 3.5 and more preferably between about 1.5 and about 3.0. The second ILD layer (124) may also comprise an organic polymer selected from the group consisting of polyimides, parylene, polyarylethers, organosilicates, polynaphthalenes, polyquinolines, and copolymers thereof. For example, commercially available polymers sold by Honeywell Corporation and Dow Chemical Corporation under the trade names FLARE™ and SiLK™, respectively, may be used to form the second ILD layer (124). The second ILD layer (124) may alternatively comprise a carbon doped oxide, as described above.

Examples of other types of materials that may be used to form the second ILD layer (124) include aerogel, xerogel, and spin-on-glass ("SOG"). In addition, the second ILD layer (124) may comprise either hydrogen silsesquioxane ("HSQ"), methyl silsesquioxane ("MSQ"), or other materials having the molecular structure specified above, which may be coated onto the surface of a semiconductor wafer using a conventional spin coating process. Although spin coating may be a preferred way to form the second ILD layer (124) for some materials, for others chemical vapor deposition, plasma enhanced chemical vapor deposition, a SolGel process, or foaming techniques may be preferred.

The second ILD layer (124) may also comprise a porous matrix, or a porous matrix and removable porogen combination, analogous to those described above in reference to the dielectric layers (102) of FIGS. 1 and 2. Some suitable second ILD layer (124) materials, such as those known as "zeolites", have naturally occurring interconnected pores. While the term "zeolite" has been used in reference to many highly-ordered mesoporous materials, several zeolites are known as dielectric materials, such as mesoporous silica and aluminosilicate zeolite materials. In embodiments wherein a porogen material of a first ILD layer and a porogen material comprising the second ILD layer (124) are similarly decomposable and removable, such decomposition and removal of porogens may be accomplished during the same set of subprocesses. For example, wherein both porogens are decomposable in the same solvent, it is preferable to decompose and remove both porogens together. Similarly, in embodiments wherein both porogens have a similar thermal decomposition temperature, they are decomposed and removed together. Wherein the second ILD layer (124) comprises a polymer, it is preferably formed by spin coating or chemical vapor depositing the polymer onto the surface of substrate (200), using conventional equipment and techniques. Zeolite materials may be synthesized by an aerogel or xerogel process, spin-coated into place, or deposited using chemical vapor deposition to form a voided structure upon deposition. In the case of spin coating or other deposition methods, solvent may need to be removed using evaporative techniques familiar to those skilled in the art. The second ILD layer (124) preferably has a thickness between about 10 nanometers and about 1000 nanometers.

Figure 2E:
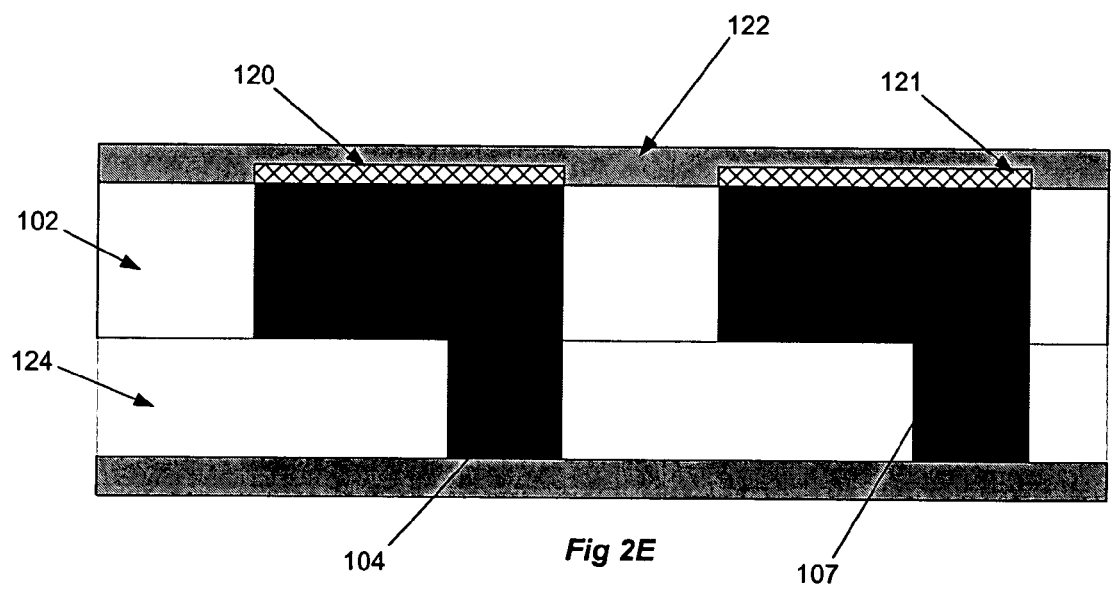

Referring to FIGS. 2B and 2C, conductive layers (104, 107) and shunt layers (120, 121) may be formed in a similar manner as discussed above in reference to FIGS. 1B and 1C. FIG. 2D depicts the structure of FIG. 2C subsequent to controlled transformation of the first ILD layer (102) by selective decomposition and removal of the porogen, leaving the porous matrix (106) and any residual porogen to comprise the first ILD layer (102). Once again, throughout the decomposition and removal process, described in further detail in reference to FIG. 1D, the surrounding structures, including the second ILD layer (124) of the embodiment depicted in FIG. 2D, remain substantially intact. FIG. 2E shows the addition of a dielectric layer (122) similar to that of FIG. 1E.

Thus, a novel inter-layer dielectric solution is disclosed. Although the invention is described herein with reference to specific embodiments, many modifications therein will readily occur to those of ordinary skill in the art. Accordingly, all such variations and modifications are included within the intended scope of the invention as defined by the following claims.

What is claimed is:

1. A method to make a microelectronic structure comprising:
    forming a first ILD layer having a first matrix and a first porogen, and a first thickness on a second ILD layer, the second ILD layer having a second thickness and a dielectric constant K higher than the first ILD layer where the second thickness is equal to or greater than the first thickness;
    forming an opening in a first ILD layer and in a second ILD layer, the opening having a line portion in the first ILD layer and a via portion in the second ILD layer;
    forming a conductive layer in the line portion in the first ILD layer and in the via portion in the second ILD layer;
    after forming the conductive layer, decomposing at least a portion of the first porogen of the first ILD layer leaving the second ILD layer structurally intact and forming a first porogen decomposition of the first ILD layer; and
    removing the first porogen decomposition of the first ILD layer from the first matrix to leave voids in the first ILD layer leaving the second ILD layer structurally intact.

2. The method of claim 1 further comprising:
    forming a shunt layer on the conductive layer to isolate the conductive layer during subsequent decomposing and removing; and
    forming a dielectric layer on the shunt layer and the first ILD layer, subsequent to the decomposing and the removing, wherein the conductive layer and the shunt layer are formed before the decomposing and the removing.

3. The method of claim 2 further comprising:
    forming a barrier layer in the second ILD layer and the first ILD layer before the forming the conductive layer.

4. The method of claim 1, wherein the mechanical strength of the second ILD layer is higher than the first ILD layer.

5. The method of claim 1, wherein the decomposition temperature of the second ILD layer is higher than the decomposition temperature of the first ILD layer.

6. A method to make a microelectronic structure, comprising:
    forming a first dielectric layer with a first thickness and a first dielectric constant on a second dielectric layer with a second thickness and a second dielectric constant, wherein the second dielectric constant is greater than the first dielectric constant and where the second thickness is equal to or greater than the first thickness on a substrate, the first dielectric layer having a matrix and a porogen;
    forming an opening in the first dielectric layer and in the second dielectric layer;
    forming a conductive interconnect in the opening in the first dielectric layer and in the second dielectric layer;
    forming a shunt layer on the conductive interconnect wherein the shunt layer is composed from a refractory metal;
    decomposing, after forming the shunt layer, at least a portion of the porogen and forming a porogen decomposition of the first dielectric layer; and
    removing the porogen decomposition of the first dielectric layer from the matrix to leave voids in the first dielectric layer, wherein the decomposing and the removing is performed leaving the second dielectric layer structurally intact.

7. The method of claim 6, further comprising
    forming a third dielectric layer on the shunt layer and on the first dielectric layer.

8. The method of claim 7, wherein the third dielectric layer is substantially impermeable to fluids.

9. The method of claim 6 further comprising
    forming a barrier layer in the opening in the first dielectric layer and in the second dielectric layer.

10. A method to make a microelectronic structure, comprising:
    forming a first dielectric layer on a second dielectric layer on a substrate, the first dielectric layer having a matrix and a porogen;
    forming an opening in the first dielectric layer and in the second dielectric layer;
    forming a conductive interconnect in the opening in the first dielectric layer and in the second dielectric layer;
    forming a shunt layer on the conductive interconnect;
    decomposing, after forming the shunt layer, at least a portion of the porogen and forming a porogen decomposition of the first dielectric layer;
    removing the porogen decomposition of the first dielectric layer from the matrix to leave voids in the first dielectric layer, wherein the decomposing and the removing is performed leaving the second dielectric layer structurally intact;
    introducing a gas into the voids in the first dielectric layer; and
    forming a dielectric layer, after introducing the gas, on the shunt layer and the first dielectric layer.

11. The method of claim 10, wherein the dielectric layer seals in gases within the voids.

12. The method of claim 10 further comprising forming a barrier layer in the opening in the first dielectric layer and in the second dielectric layer.

* * * * *